(12) United States Patent
Zanoni et al.

(10) Patent No.: US 10,069,619 B1
(45) Date of Patent: Sep. 4, 2018

(54) OPTICAL SAMPLE AND HOLD SYSTEM AND METHOD

(71) Applicants: Raymond Zanoni, Columbia, MD (US); Kim S. Jepsen, Ellicott City, MD (US); Mark A. Laliberte, Crownsville, MD (US); Oliver S. King, Frederick, MD (US)

(72) Inventors: Raymond Zanoni, Columbia, MD (US); Kim S. Jepsen, Ellicott City, MD (US); Mark A. Laliberte, Crownsville, MD (US); Oliver S. King, Frederick, MD (US)

(73) Assignee: ROCKWELL COLLINS, INC., Cedar Rapids, IA (US)

( * ) Notice: Subject to any disclaimer, the term of this patent is extended or adjusted under 35 U.S.C. 154(b) by 55 days.

(21) Appl. No.: 13/787,202

(22) Filed: Mar. 6, 2013

Related U.S. Application Data

(63) Continuation-in-part of application No. 13/204,158, filed on Aug. 5, 2011, now Pat. No. 8,442,402, and a
(Continued)

(51) Int. Cl.
*H04B 10/06* (2006.01)
*H04L 7/00* (2006.01)

(52) U.S. Cl.
CPC ................... *H04L 7/0075* (2013.01)

(58) Field of Classification Search
None
See application file for complete search history.

(56) References Cited

U.S. PATENT DOCUMENTS 4,384,291 A 5/1983 Lewis et al.
4,694,276 A 9/1987 Rastegar
(Continued)

FOREIGN PATENT DOCUMENTS

WO WO 2011/010314 A2 1/2011

OTHER PUBLICATIONS

Kikuchi, Coherent Optical Communications: Historical Perspectives and Future Directions, 2010, High Spectral Density Optical Communiocation Technologies, Optical and Fiber Communication Reports, Springer-Verlag Berlin Heidelber, pp. 11-49.*
(Continued)

*Primary Examiner* — Ken N Vanderpuye
*Assistant Examiner* — David Lambert
(74) *Attorney, Agent, or Firm* — Donna P. Suchy; Daniel M. Barbieri

(57) ABSTRACT

A method of performing optical serial-to-parallel conversion of an optical signal includes performing phase modulation of the optical pulse stream and outputting a phase-modulated optical signal as a result thereof. The method also includes performing optical switching of the phase-modulated optical signal by optical switches connected to each other in a series relationship on a signal path. The method further includes performing optical switching of a reference optical clock signal by optical switches connected to each other in a series relationship on a reference path. The method also includes performing, by I/Q demodulators, I/Q demodulation of the optically switched phase-modulated optical signal respectively output by one of the optical switches on the signal path at timings corresponding to the optically switched reference optical clock signal respectively output by one of the optical switches on the reference path, in which the I/Q demodulators respectively output I and Q demodulated signals as a result thereof. The method further includes
(Continued)

performing, by pairs of gated photodetectors respectively connected to the I/Q demodulators, photodetection of the I and Q demodulated signals respectively output of the I/Q demodulators.

15 Claims, 8 Drawing Sheets

Related U.S. Application Data continuation-in-part of application No. 13/240,226, filed on Sep. 22, 2011, now Pat. No. 8,456,336, and a continuation-in-part of application No. 13/536,929, filed on Jun. 28, 2012, now Pat. No. 8,837,956, and a continuation-in-part of application No. 13/626,642, filed on Sep. 25, 2012, now Pat. No. 8,779,955.

(56) References Cited

U.S. PATENT DOCUMENTS

| | | |
|---|---|---|
| 4,732,447 A | 3/1988 | Wright et al. |
| 4,928,007 A | 5/1990 | Furstenau et al. |
| 4,968,986 A | 11/1990 | Wagner |
| 5,010,346 A * | 4/1991 | Hamilton et al. ............ 341/137 |
| 5,109,441 A | 4/1992 | Glaab |
| 5,955,875 A | 9/1999 | Twichell et al. |
| 6,118,396 A | 9/2000 | Song |
| 6,188,342 B1 | 2/2001 | Gallo |
| 6,326,910 B1 | 12/2001 | Hayduk et al. |
| 6,404,365 B1 | 6/2002 | Heflinger |
| 6,404,366 B1 | 6/2002 | Clark et al. |
| 6,420,985 B1 | 7/2002 | Toughlian et al. |
| 6,459,522 B2 | 10/2002 | Yariv |
| 6,469,649 B1 | 10/2002 | Helkey et al. |
| 6,525,682 B2 | 2/2003 | Yap et al. |
| 6,529,150 B1 | 3/2003 | Shoop et al. |
| 6,567,436 B1 | 5/2003 | Yao et al. |
| 6,661,361 B1 | 12/2003 | Lewis et al. |
| 6,700,517 B1 | 3/2004 | Kellar |
| 6,714,149 B2 | 3/2004 | Nunnally |
| 6,771,201 B1 | 8/2004 | Currie |
| 7,376,349 B2 | 5/2008 | Ionov et al. |
| 7,389,055 B1 * | 6/2008 | Rickard ............... H04B 10/505 398/206 |
| 7,471,224 B2 | 12/2008 | Babbitt et al. |
| 7,471,903 B1 * | 12/2008 | Friskney ............ H04B 10/5161 398/185 |
| 7,564,387 B1 | 7/2009 | Vawter et al. |
| 7,570,184 B2 | 8/2009 | Ikeda et al. |
| 7,671,771 B2 | 3/2010 | Hirono et al. |
| 7,826,752 B1 | 11/2010 | Zanoni et al. |
| 7,847,715 B2 | 12/2010 | Keith |
| 7,867,246 B2 | 1/2011 | Eliot |
| 7,868,799 B1 | 1/2011 | Price et al. |
| 7,876,246 B1 | 1/2011 | Price et al. |
| 7,956,788 B2 | 6/2011 | Lee et al. |
| 7,990,299 B2 | 8/2011 | Bell |
| 8,263,928 B1 | 9/2012 | Efimov |
| 8,315,387 B2 | 11/2012 | Kanter et al. |
| 8,442,402 B1 | 5/2013 | Zanoni et al. |
| 8,446,305 B1 | 5/2013 | Zanoni et al. |
| 8,456,336 B1 | 6/2013 | Zanoni et al. |
| 8,466,819 B2 | 6/2013 | Woodward et al. |
| 8,548,331 B1 | 10/2013 | Zanoni et al. |
| 8,779,955 B1 | 7/2014 | Zanoni et al. |
| 8,837,956 B1 | 9/2014 | Zanoni et al. |
| 2002/0067299 A1 | 6/2002 | Clark et al. |
| 2002/0163454 A1 * | 11/2002 | Yap et al. .................... 341/137 |
| 2006/0093375 A1 * | 5/2006 | Futami et al. .............. 398/155 |
| 2007/0159369 A1 | 7/2007 | Currie et al. |
| 2007/0223936 A1 | 9/2007 | Babbitt et al. |
| 2009/0236501 A1 * | 9/2009 | Takahashi et al. ....... 250/214 R |
| 2010/0002281 A1 | 1/2010 | McDonald |
| 2011/0002029 A1 | 1/2011 | McDonald |
| 2011/0221627 A1 | 9/2011 | Pierno et al. |
| 2011/0234435 A1 | 9/2011 | Woodward et al. |
| 2012/0087653 A1 | 4/2012 | Sawada et al. |
| 2012/0212360 A1 * | 8/2012 | Kanter ............... H03M 1/1245 341/120 |
| 2012/0213531 A1 * | 8/2012 | Nazarathy et al. .......... 398/202 |
| 2012/0219302 A1 | 8/2012 | Sun et al. |
| 2012/0224184 A1 | 9/2012 | Li et al. |
| 2012/0299446 A1 | 11/2012 | Shmilovich et al. |
| 2013/0016004 A1 | 1/2013 | Pierno et al. |
| 2013/0062508 A1 * | 3/2013 | Kanter ............... H03M 1/1265 250/214 DC |
| 2013/0077962 A1 | 3/2013 | Wu et al. |
| 2013/0113641 A1 | 5/2013 | Sudo et al. |
| 2013/0136450 A1 | 5/2013 | Roberts et al. |
| 2013/0328706 A1 | 12/2013 | Marom |
| 2014/0005966 A1 | 1/2014 | Fireaizen et al. |

OTHER PUBLICATIONS

Wikipedia—Clock Signal, [online], retrieved on May 9, 2017. Retrieved from, <URL: https://en.wikipedia.org/wiki/Clock_signal>, 5 pages.*
U.S. Appl. No. 13/787,202, filed Mar. 6, 2013, Zanoni et al.
Notice of Allowance for U.S. Appl. No. 13/243,208, dated Jun. 6, 2013, 11 pages.
Office Action on U.S. Appl. No. 13/536,929 dated Mar. 6, 2014, 10 pages.
U.S. Appl. No. 13/204,158, filed Aug. 5, 2011, Zanoni et al.
U.S. Appl. No. 13/240,226, filed Sep. 22, 2011, Zanoni et al.
U.S. Appl. No. 13/626,642, filed Sep. 25, 2012, Zanoni et al.
Clark et al., Coherent Optical Phase-Modulation Link, IEEE Photonics Technology Letters, Aug. 15, 2007, 3 pages.
Clark et al., Photonics for RF Front Ends, IEEE Microwave Magazine, May 2011, 9 pages.
Valley et al., Photonic Analog-To-Digital Converters: Fundamental and Practical Limits, Integrated Optical Devices, Nanostructures, and Displays, Proceedings of SPIE, 2004, 11 pages.
Valley, Photonic Analog-to-Digital Converters, The Aerospace Corporation, 2009, 48 pages.
Valley, Photonic Analog-To-Digital Converters, The Aerospace Corporation, Mar. 5, 2007, 28 pages.
Zibar et al., Digital Coherent Receiver Employing Photonic Downconversion for Phase Modulated Radio-over-Fibre Links, downloaded on Aug. 2, 2010 from IEEE Xplore, 4 pages.
Zibar et al., Digital Coherent Receiver for Phase-Modulated Radio-Over-Fiber Optical Links, IEEE Photonics Technology Letters, Feb. 1, 2009, 3 pages.
Notice of Allowance for U.S. Appl. No. 13/204,158, dated Jan. 29, 2013, 10 pages.
Notice of Allowance for U.S. Appl. No. 13/240,226, dated Feb. 14, 2013, 4 pages.
Office Action on U.S. Appl. No. 13/963,899 dated Feb. 12, 2015, 16 pages.
Non-Final Office Action on U.S. Appl. No. 14/023,338 dated Mar. 2, 2015, 9 pages.
Final Office Action on U.S. Appl. No. 13/963,899 dated May 26, 2015, 26 pages.
Non-Final Office Action on U.S. Appl. No. 13/963,899, dated Sep. 2, 2015, 14 pages.

* cited by examiner

OPTICAL SAMPLE AND HOLD SYSTEM AND METHOD

CROSS-REFERENCE TO RELATED APPLICATIONS

This application is a continuation-in-part of U.S. patent application Ser. No. 13/240,226 entitled "OPTICAL DESERIALIZATION WITH GATED DETECTORS: SYSTEM AND METHOD", filed on Sep. 22, 2011, by Zanoni et al., U.S. patent application Ser. No. 13/204,158 entitled "WIDE BAND DIGITAL RECEIVER: SYSTEM AND METHOD", filed on Aug. 5, 2011, by Zanoni et al., U.S. patent application Ser. No. 13/626,642 entitled "OPTICAL ANALOG-TO-DIGITAL CONVERSION SYSTEM AND METHOD WITH ENHANCED QUANTIZATION", filed on Sep. 25, 2012, by Zanoni et al., and U.S. patent application Ser. No. 13/536,929 entitled "PIPELINED RECEIVER SYSTEM AND METHOD", filed on Jun. 28, 2012, by Zanoni et al. assigned to the Assignee of this patent application and incorporated in their entireties herein by reference.

FIELD OF THE INVENTION

The present specification relates to optical deserialization with gated detectors. More particularly, the present specification relates to a photonic analog-to-digital converter (pADC) that performs optical deserialization with gated detectors for use in high frequency (e.g., 100+MHz and multi-GHz) radio frequency (rf) systems.

Optical system designers have utilized optical deserialization as a component of pADCs used in high frequency (e.g., 100+MHz and multi-GHz) systems. Fundamental performance limits of conventional pADCs significantly constrain the potential of these devices, such as systems operating wide band in excess of several GHz.

Therefore, there is a need to have a pADC that performs optical deserialization with gated detectors and that has increased resolution compared to a conventional pADC that performs optical deserialization.

SUMMARY OF THE INVENTION

An exemplary embodiment relates to a photonic processor. The photonic processor includes a phase modulator, at least one optical demodulator, and at least one photo converter. The phase modulator is configured to receive a first electronic signal and an optical clock signal and to provide a phase-modulated optical pulse signal. The at least one optical demodulator respectively is configured to receive the phase-modulated optical pulse signal on a signal path and the optical clock signal on a reference path. The demodulator is also configured to perform demodulation and to provide an optical demodulated signal. The at least one photo converter is configured to receive the optical demodulated signal and to provide a second electronic signal corresponding to the optical demodulated signal. The sampling is performed in the optical domain and the second electronic signal is held by the photo converter.

Another exemplary embodiment relates to a method of multi-dimensional quantization. The method includes performing phase modulation and providing a phase-modulated optical pulse signal, performing demodulation of the phase-modulated optical signal to provide an optical demodulated signal. The method also includes converting the optical demodulated signal to an electronic signal, and holding the electronic signal for reception by an electronic quantizer.

Yet another exemplary embodiment relates to a photonic processor. The photonic processer includes a phase modulator configured to receive an electronic radio frequency signal and an optical clock signal and to provide a phase-modulated optical signal. The photonic processer also includes a demodulator configured to receive the phase-modulated optical signal output by the phase modulator on a signal path and to provide demodulation of the phase-modulated optical signal in response to an optical clock received on a reference path. The demodulator provides an optical first demodulated signal and an optical second demodulated signal. The photonic processor also includes first and second detectors coupled to the demodulator and configured to receive respectively the optical first demodulated signal and the optical second demodulated signal and to provide a hold function for an electronic first demodulated signal and an electronic second demodulated signal.

An exemplary embodiment relates to a photonic Analog-to-Digital Converter (pADC) that includes a phase modulator that is configured to receive an rf signal and to output a phase-modulated optical clock signal as a result thereof. The pADC also includes a plurality of optical switches connected in a series relationship to each other along a signal path, the plurality of optical switches on the signal path performing optical switching of the phase-modulated optical signal output by the phase modulator in accordance with the series relationship by which the plurality of optical switches on the signal path are connected to each other. The pADC further includes a plurality of optical switches connected in a series relationship to each other along a reference path, the plurality of optical switches on the reference path performing optical switching of a reference optical signal in accordance with the series relationship by which the plurality of optical switches on the reference path are connected to each other. The method still further includes a plurality of I/Q demodulators respectively connected to receive sampled outputs from the plurality of optical switches on the signal path and to receive switched outputs from the plurality of optical switches on the reference path, in which each of the plurality of I/Q demodulators performs I and Q demodulation of the received switched outputs from the plurality of optical switches on the signal path at timings corresponding to the switched outputs of the plurality of optical switches on the reference path, and in which each of the plurality of I/Q demodulators outputs an I demodulated signal and a Q demodulated signal as a result thereof. The method also includes a plurality of pairs of gated photodetectors respectively connected to the plurality of I/Q demodulators, in which one of each of the pairs of gated photodetectors receives the I demodulated signal output from the respective I/Q demodulator and the other one of each of the pairs of gated photodetectors receives the Q demodulated signal output from the respective I/Q demodulator, and in which each of the pairs of gated photodetectors performs photodetection of the respective I demodulated signal and the Q demodulated signal output by the respective I/Q demodulator.

Another exemplary embodiment relates to a method of performing optical serial-to-parallel conversion of an rf signal. The method includes modulating the phase of the optical clock signal in proportion to the rf input signal and outputting a phase-modulated optical signal as a result thereof. The method also includes performing optical switching of the phase-modulated optical signal by a plurality of optical switches connected to each other in a series relationship on a signal path. The method further includes performing optical switching of a reference optical clock signal by a plurality of optical switches connected to each other in a series relationship on a reference path. The method still further includes performing, by a plurality of I/Q demodulators, I/Q demodulation of the optically sampled phase-modulated optical signal respectively output by one of the plurality of optical switches on the signal path at timings corresponding to the optically switched reference optical clock signal respectively output by one of the plurality of optical switches on the reference path, in which the plurality of I/Q demodulators respectively output I and Q demodulated signals as a result thereof. The method also includes performing, by a plurality of pairs of gated photodetectors respectively connected to the plurality of I/Q demodulators, photodetection of the I and Q demodulated signals respectively output of the plurality of I/Q demodulators.

Another exemplary embodiment relates to a computer readable medium storing computer program product that, when executed by a computer, causes the computer to perform a functions of:

instruct a phase modulator to perform phase modulation of the optical clock signal in proportion to the rf input signal and to output a phase-modulated optical signal as a result thereof;

instruct a plurality of optical switches connected to each other in a series relationship on a signal path to perform optical switching of the phase-modulated optical signal;

instruct a plurality of optical switches connected to each other in a series relationship on a reference path to perform optical switching of a reference optical clock signal;

instruct a plurality of I/Q demodulators to perform I/Q demodulation of the optically switched phase-modulated optical signal respectively output by one of the plurality of plurality of optical switches on the signal path at timings corresponding to the optically switched reference optical clock signal respectively output by one of the plurality of plurality of optical switches on the reference path, in which the plurality of I/Q demodulators respectively output I and Q demodulated signals as a result thereof; and instruct a plurality of pairs of gated photodetectors respectively connected to the plurality of I/Q demodulators to perform photodetection of the I and Q demodulated signals respectively output of the plurality of I/Q demodulators.

Yet another exemplary embodiment relates to a photonic Analog-to-Digital Converter (pADC), which includes a phase modulator that is configured to received an rf signal and to output a phase-modulated optical signal as a result thereof; an I/Q demodulator configured to receive the phase-modulated optical signal output by the phase modulator on a signal path, and to perform I and Q demodulation of the phase-modulated optical signal at timings corresponding to a reference clock signal received on a reference path, wherein the I/Q demodulator outputs an I demodulated signal and a Q demodulated signal as a result thereof; and first and second photodetectors connected to the I/Q demodulator and configured to receive and detect the I demodulated signal and a Q demodulated signal, respectively.

Still yet another exemplary embodiment relates to a method of performing optical serial-to-parallel conversion of an rf signal, which includes phase modulating an optical clock signal in proportion to an input rf input signal and outputting a phase-modulated optical signal as a result thereof; performing I and Q demodulation of the phase-modulated optical signal at timings corresponding to a reference clock signal received on a reference path, and outputting an I demodulated signal and a Q demodulated signal as a result thereof; and receiving and detecting, by way of first and second photodetectors, the I demodulated signal and a Q demodulated signal, respectively.

BRIEF DESCRIPTION OF THE DRAWINGS

Exemplary embodiments are hereafter described with reference to the accompanying drawings, wherein like numerals denote like elements; and.

DETAILED DESCRIPTION OF THE PREFERRED EMBODIMENTS

Figure 1:
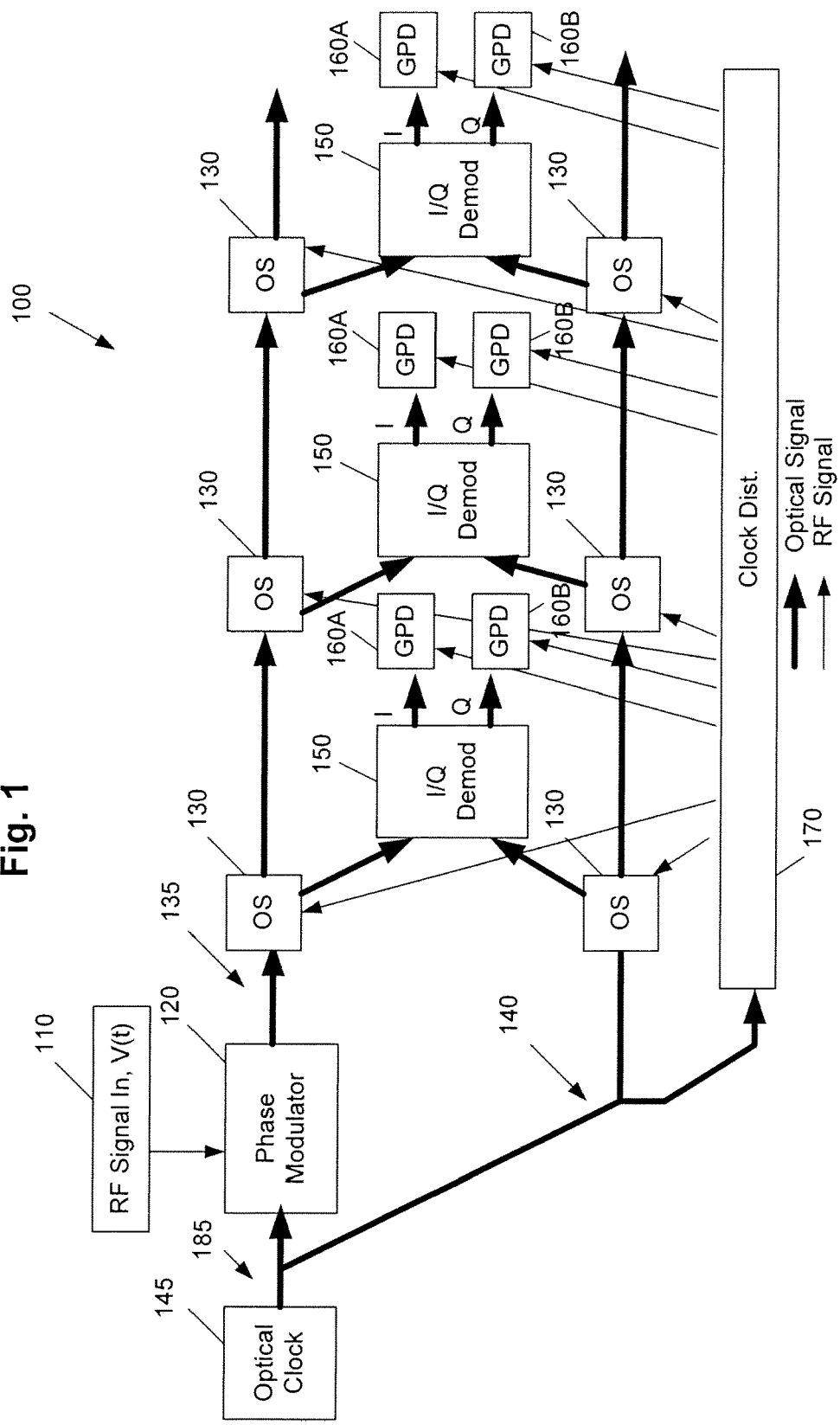
FIG. 1 is a block diagram of a photonic ADC (pADC) according to a first exemplary embodiment.

Before describing in detail the particular improved system and method, it should be observed that the invention includes, but is not limited to, a novel structural combination of optical components and not in the particular detailed configurations thereof. Accordingly, the structure, methods, functions, control and arrangement of components have been illustrated in the drawings by readily understandable block representations and schematic drawings, in order not to obscure the disclosure with structural details which will be readily apparent to those skilled in the art, having the benefit of the description herein. Further, the invention is not limited to the particular embodiments depicted in the exemplary diagrams, but should be construed in accordance with the language in the claims.

At least one embodiment relates to an optical deserializer with gated detectors utilized in a pADC, for example, a pADC provided in a wideband or narrowband rf receiver. The pADC can be used for different types of receiving applications, including but not limited to applications associated with radios (e.g., software defined radio, radio receivers capable of wideband or narrowband receiver operations, etc.), radars (e.g., a digital radar), and sensors.

The present invention relates to a method known in the art as Multi-Dimensional Quantization (MDQ), and improves on MDQ methods and apparatuses described, for example, in U.S. Pat. No. 7,868,799. In general, technical benefits of the MDQ method includes the capability to: increase the ENOB of the photonic ADC over that of the constituent electronic ADCs; increase the SFDR of the photonic ADC over that of the constituent electronic ADCs; enable the use of optical or hybrid optical/electrical deserialization to reduce the effective sample rate presented to each electronic ADC; allow for simple correction for various imperfections of the optical receiver. Performing the sampling process using phase modulated optical pulses, as contrasted to simply relaying the RF signal on a phase modulated continuous wave optical carrier to an electronic ADC for sampling is important. This is because optical sampling allows the sampling to occur using an ultra-low jitter optical pulse source. Without the low jitter associated with optical sampling, the above benefits cannot be realized, because the performance will be limited by the clock jitter on the clock that drives the electronic ADCs. Various embodiments of the present invention can achieve one or more of the benefits described above.

FIG. 1 shows a pADC 100 according to a first embodiment. The pADC 100 includes an optical clock 145 for the purpose of supplying a high repetition rate stream of optical pulses with very low clock jitter. Examples of this type of device include the mode locked laser (MLL) and coupled opto-electronic oscillator (COEO).

The pADC 100 receives an rf voltage V(t) of an rf input signal 110. The rf input signal 110 can be received by a wide band antenna (not shown in FIG. 1), for example. The rf input signal 110 is input to a phase modulator 120, which performs phase modulation on the optical clock signal and which outputs a phase-modulated optical pulse stream.

The pADC 100 also includes a plurality of optical switches (OS) 130 connected in a series relationship to each other along a signal path 135. The plurality of optical switches 130 on the signal path 135 perform optical switching of the phase-modulated optical signal output by the phase modulator 120 in accordance with the series relationship by which the plurality of optical switches 130 on the signal path 135 are connected to each other.

The pADC 100 further includes a plurality of optical switches (OS) 130 connected in a series relationship to each other along a reference path 140. The plurality of optical switches 130 on the reference path 140 perform optical switching of a reference optical signal output by an optical clock circuit 145 in accordance with the series relationship by which the plurality of optical switches 130 on the reference path 140 are connected to each other.

The pADC 100 also includes a plurality of I/Q demodulators 150 respectively connected to receive switched outputs from the plurality of optical switches 130 on the signal path 135 and to receive switched outputs from the plurality of optical switches 130 on the reference path 140. Each of the plurality of I/Q demodulators 150 performs I/Q demodulation of the received switched outputs from the plurality of optical switches 130 on the signal path 135 at timings corresponding to the switched outputs of the plurality of optical switches 130 on the reference path 140. Each of the plurality of I/Q demodulators outputs an I demodulated signal and a Q demodulated signal as a result of the I/Q demodulation that it performs on the optically-switched phase-modulated optical signal.

The pADC 100 further includes a plurality of pairs of gated photodetectors 160A, 160B respectively connected to the plurality of I/Q demodulators 150. One of the pair of gated photodetectors 160A receives the I demodulated signal output from the respective I/Q demodulator 150, and the other one of the pair of gated photodetectors 160B receives the Q demodulated signal output from the respective I/Q demodulator 150. Each of the pairs of gated photodetectors 160A, 160B performs photodetection of the respective I demodulated signal and the Q demodulated signal output by the respective I/Q demodulator.

The pADC 100 also includes a clock distribution unit 170 that outputs clock signals to the plurality of pairs of gated photodetectors 160A, 160B, as well as to the optical switches 130. Each of the plurality of pairs of gated photodetectors 160A, 160B performs photodetection of the respective I demodulated signal and the Q demodulated signal output by the respective I/Q demodulator 150 at timings in accordance with the clock signal that it receives (e.g., at a rising edge or falling edge of each clock signal pulse).

The plurality of pairs of gated photodetectors 160A, 160B hold the respective I demodulated signal and the Q demodulated signal output by the respective I/Q demodulator 150 for a clock cycle of the clock signal, and thereby perform a "hold" function of a sample-and-hold circuit. The optical clock signal 185 is comprised of short optical pulses with a repetition rate satisfying the Nyquist criterion with respect to the RF input signal. The phase modulator 120 accepts this clock signal and imparts to it a phase modulation proportional to the rf input signal and thereby performs a "sample" function of a sample-and-hold circuit.

As shown in FIG. 1, the signal path 135 and the reference path 140 are separate paths that do not directly intersect or directly connect with each other, but whereby both paths provide input signals to the I/Q demodulators 150.

An optical clock circuit 145 outputs a reference optical clock signal 185 to the phase modulator 120 and to the reference path 140. Based on the rf signal 110 input to it, the phase modulator 120 performs phase modulation of the optical clock signal 185 resulting in a phase modulated optical pulse signal. The reference optical clock signal 185 is also provided as in input to the clock distribution unit 170, for it to use in providing clock signals to various components of the pADC 100.

Figure 2:
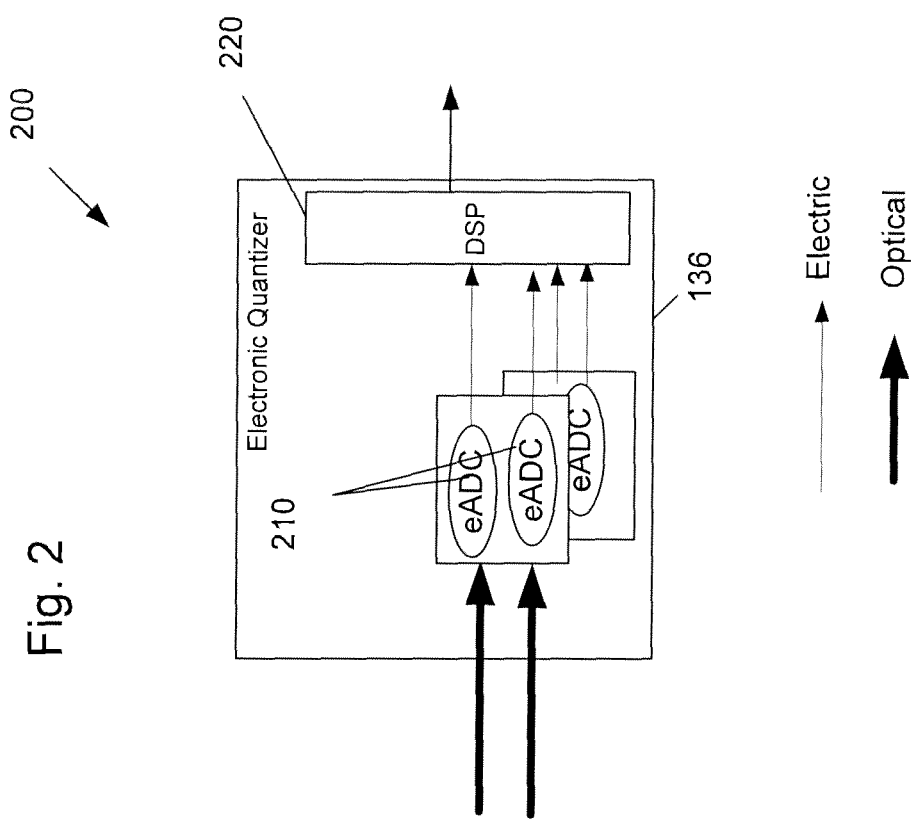
FIG. 2 is a block diagram of an electronic quantizer that may be utilized to further process outputs of a pADC according to an exemplary embodiment.

The pADC 100 of FIG. 1 can operate as an optical serial-to-parallel converter that enables a serial stream of samples, e.g., 20 GHz samples of an input rf signal, to be clocked into a parallel array of I/Q demodulators 150. By utilizing gated photodetectors 160A, 160B, the optical pulses can be captured and held until electronic quantizers digitize the "held" signals. FIG. 2 shows one implementation of an electronic quantizer 200 that may be utilized with the pADC 100 of the first embodiment, in which the electronic quantizer 200 receives the "held" signals of the gated photodetectors 160A, 160B, and performs digitization of those signals. The electronic quantizer 200 includes a plurality of electronic ADCs 210, which provide their respective outputs to a digital signal processor (DSP) 220. The DSP 220 may perform additional digital processing of the received signals, such as filtering, smoothing, interleaving and the like.

In the pADC 100 according to the first embodiment as shown in FIG. 1, the sampling is performed of the received signal in the optical domain, which is something not done in conventional sample-and-hold circuits used in rf front ends. Also, the holding function of the sample-and-hold circuit of FIG. 1 is accomplished with a combination of electronics and optical components, again something different than what is done in conventional sample-and-hold circuits used in rf front ends.

Test results of the pADC 100 according to the first embodiment as shown in FIG. 1 show that input voltage requirements can be reduced from 15 to 20 volts as required by conventional pADCs, to a factor of four or more (i.e., between 3 to 4 volts input voltage level to the pADC 100 of FIG. 1). Also, the input power requirement of the pADC 100 according to the first embodiment as shown in FIG. 1 can be reduced by more than 14 dB as compared to the input power requirement of a conventional pADC.

Figure 3:
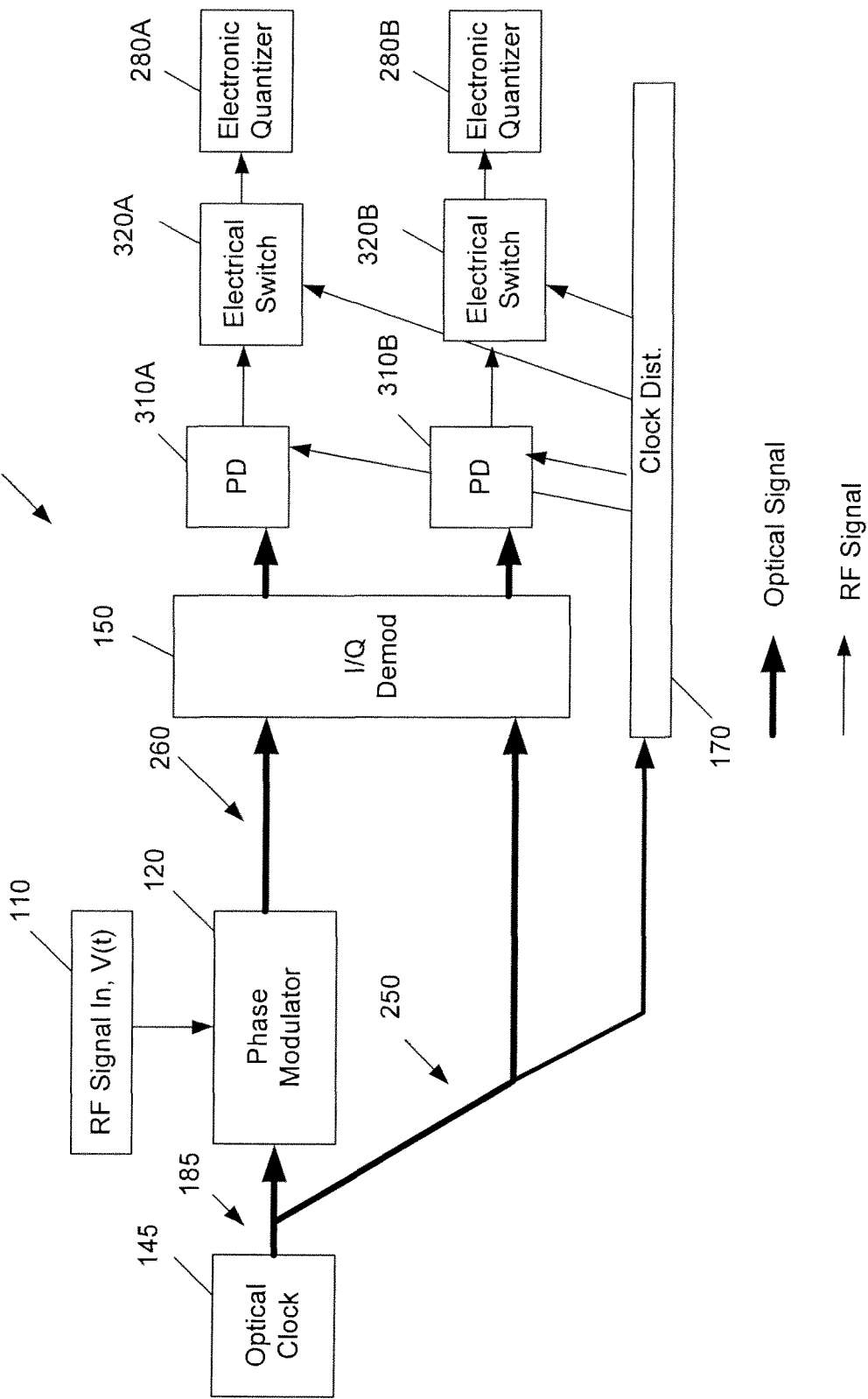
FIG. 3 is a block diagram of a pADC according to a second exemplary embodiment.

A pADC 300 according to a second embodiment is shown with reference to FIG. 3. The pADC 300 includes an optical clock 145 that outputs a reference optical clock signal 185 to a phase modulator 120 and to a reference path 250. The phase modulator 120 performs phase modulation of the optical clock signal 185 in proportion to the input rf signal 120 resulting in a phase modulated optical signal. The phase-modulated output of the phase modulator 120 is provided on a signal path 260. Unlike the first embodiment of a pADC 100 shown in FIG. 1, no optical switches (OS) are utilized in the second embodiment.

The pADC 300 also includes an I/Q demodulator 150 that receives the phase-modulated rf signal output by the phase modulator 120 on the signal path 260, and that receives the reference optical clock signal 185 on the reference path 250. Like the first embodiment, the I/Q demodulator 150 performs I and Q demodulation of the phase-modulated optical signal at timings corresponding to the reference optical clock signal 185, and the I/Q demodulator 150 outputs an I demodulated signal and a Q demodulated signal as a result of the I/Q demodulation that it performs on the phase-modulated optical signal.

The pADC 300 further includes a plurality of pairs of gated photodetectors 160A, 160B respectively connected to the I and Q outputs of the I/Q demodulator 150. The gated photodetector 160A receives the I demodulated signal output from the I/Q demodulator 150, and the gated photodetector 160B receives the Q demodulated signal output from the I/Q demodulator 150. The gated photodetectors 160A, 160B respectively perform photodetection of the respective I demodulated signal and the Q demodulated signal output by the I/Q demodulator 150.

The pADC 300 also includes a clock distribution unit 170 that outputs a clock signal to the gated photodetectors 160A, 160B. The gated photodetectors 160A, 160B perform photodetection of the respective I demodulated signal and the Q demodulated signal output by the respective I/Q demodulator 150 at timings in accordance with the clock signal (e.g., at a rising edge or falling edge of each clock signal pulse).

As shown in FIG. 3, the signal path 260 and the reference path 250 are separate paths that do not directly intersect or directly connect with each other, but whereby each paths provides one input to the I/Q demodulator 150.

Also shown in the pADC 300 of FIG. 3 are electronic quantizers 280A, 280B, which respectively perform electronic quantization of signals held by electrical switches 320A, 320B. By way of example, the electronic quantizers 280A, 280B may include the components shown in FIG. 2. The output of the photodetectors 310A, 310B is held by electrical switches 320A, 320B, respectively, whereby the electrical switches 320A, 320B are clocked based on the clock signal output by the clock distribution unit 170

Figure 4:
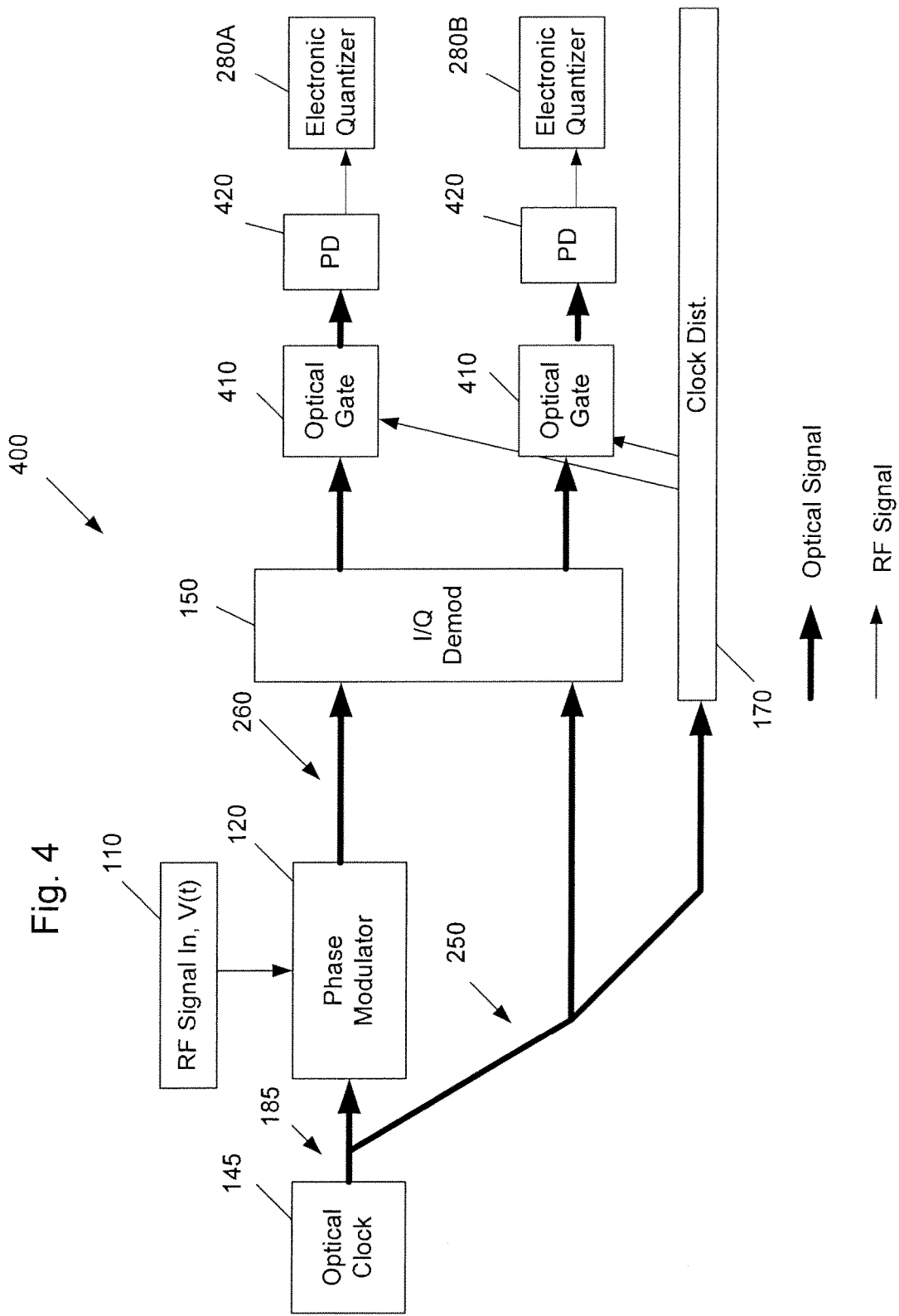
FIG. 4 is a block diagram of a pADC according to a third exemplary embodiment.

A pADC 400 according to a third embodiment is shown with reference to FIG. 4. The pADC 400 is similar in construction to the pADC 300 according to the second embodiment as shown in FIG. 3, but in which the electronic switches 320A, 320B of the second embodiment are replaced by optical gates provided on each of the I and Q output paths of the I/Q demodulator 150. Thus, unlike the second embodiment, in the third embodiment the signals output by the I/Q demodulator 150 are first optically gated, and then photodetected. That way, during the optical gating performed by the optical gates 410, there is reduced capacitive coupling with the electronic clock signal output by the clock distribution unit 170 to the optical gates 410, since the gating of the I/Q demodulated outputs is performed in the 'optical' realm and not the 'electronic' realm. Accordingly, the pADC 400 according to the third embodiment may reduce the capacitive coupling, which is a limitation of eADCs, and thus may result in improved performance of the pADC 400 as compared to the second embodiment.

Figure 5:
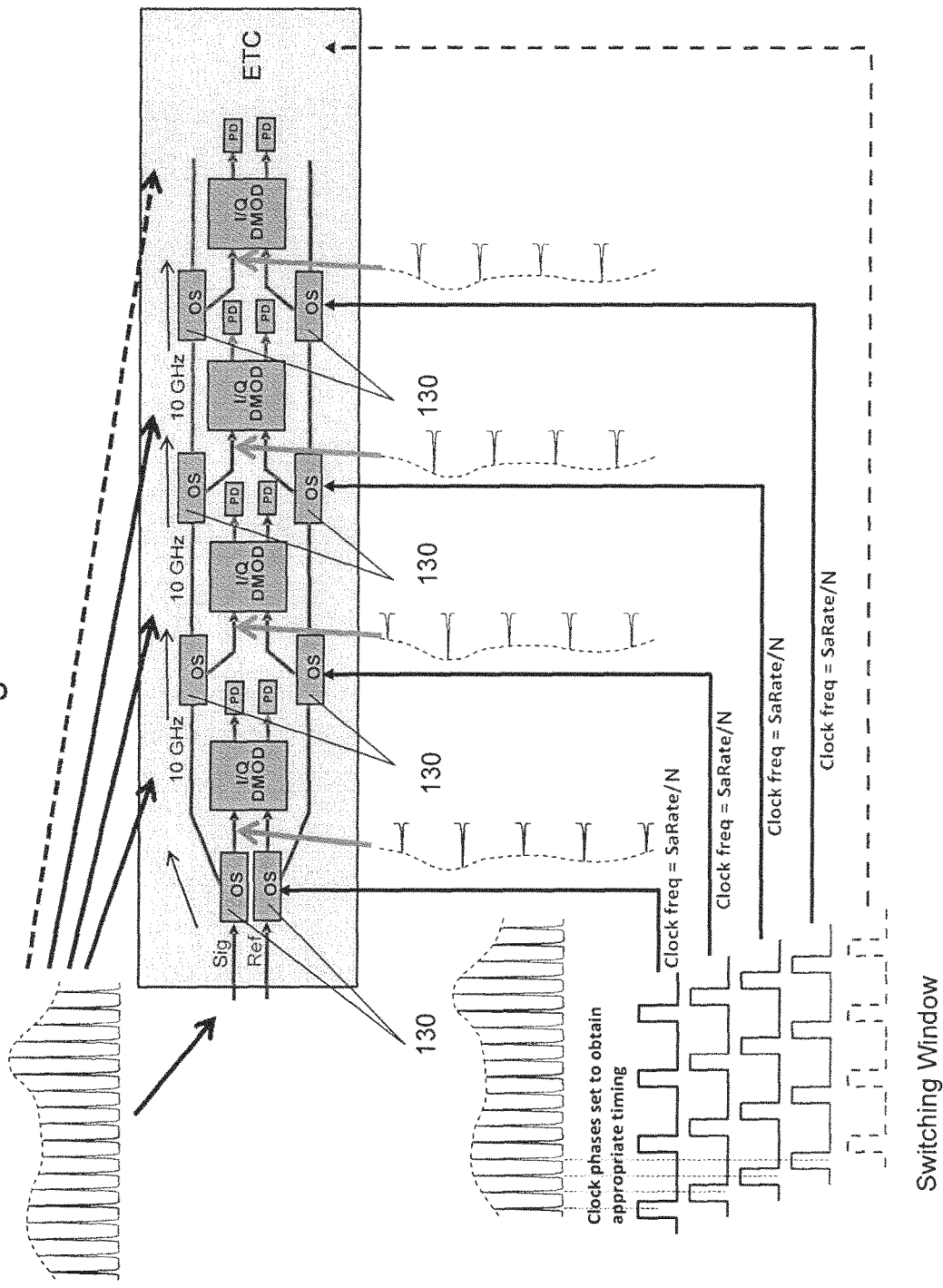
FIG. 5 is a block diagram of a clock distribution tree for the clock signals provided to components of a pADC or optical deserializer with gated detectors according to the first exemplary embodiment.

FIG. 5 is a block diagram of a clock distribution tree for the clock signals provided to components of a pADC or optical deserializer with gated detectors by the clock distribution unit according to the first exemplary embodiment. The first stage of optical switches (OSs) 130 on the signal and reference paths receive a first clock signal having a clock frequency of SaRate/N ("SaRate" corresponds to Sampling Rate), the second stage of OSs 130 on the signal and reference paths receive a second clock signal also having a clock frequency of SaRate/N, delayed from the first clock signal by a time interval N/SaRate, . . . , and the nth stage of OSs 130 on the signal and reference paths receive an nth clock signal having a clock frequency of SaRate/N and delayed by a time interval (n−1)*N/SaRate.

Figure 6:
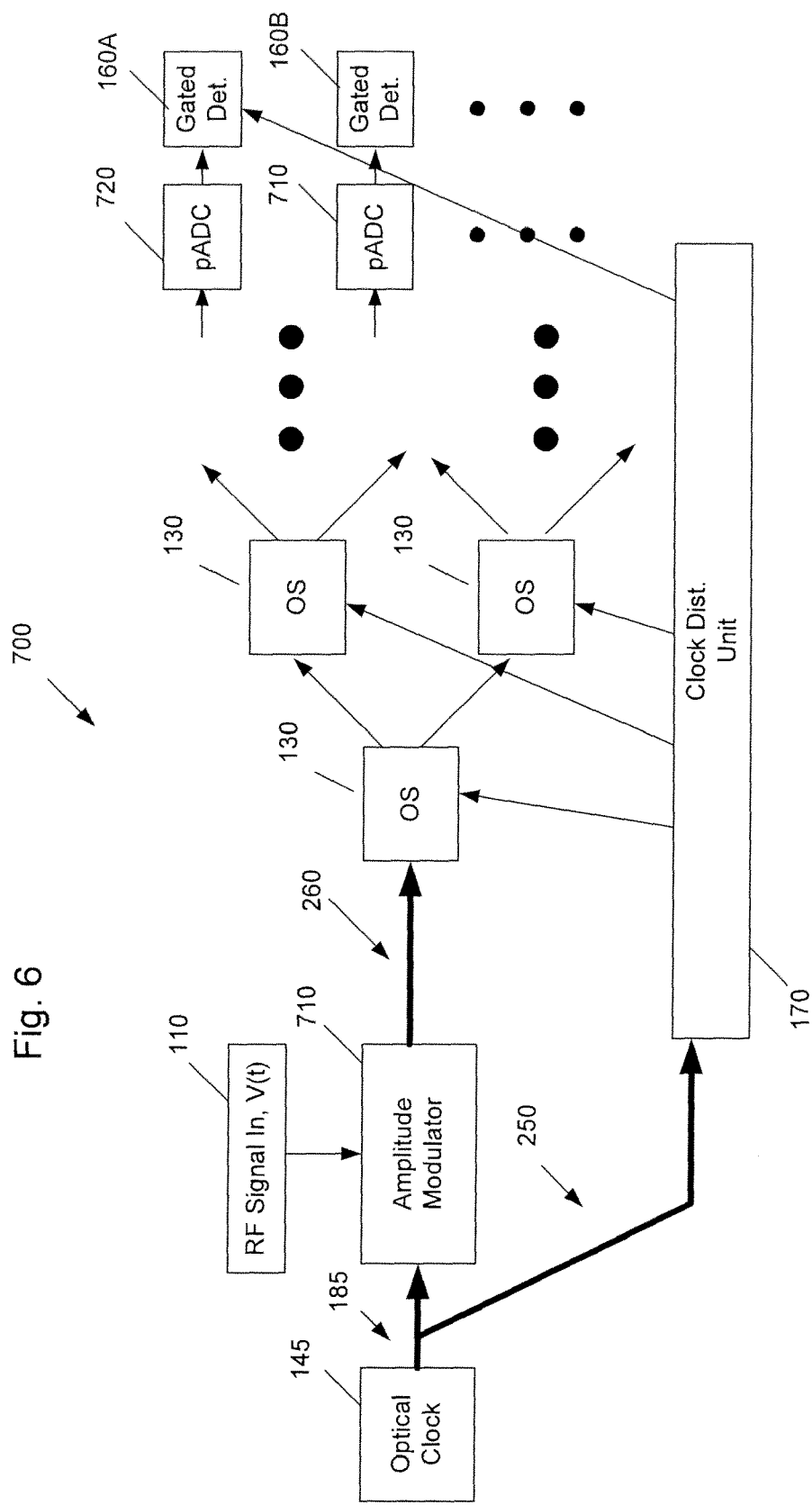
FIG. 6 is a block diagram of an optical deserializer with gated detectors according to a fourth exemplary embodiment.

FIG. 6 shows an optical deserializer with gated detectors 700 according to a fourth embodiment, in which the optical clock signal is amplitude modulated according to RF input signal 110 by amplitude modulator 710, The amplitude-modulated output of the amplitude modulator 710 is provided to n stages of optical switches 130 (n being an integer greater than one). The output of the last (nth) stage of optical switches 130 is provided to a plurality of pADCs 720, which perform analog-to-digital conversion of the optically-switched signals output by the last stage of optical switches 130. The digital outputs of the pADCs 720 are held by gated detectors 160A, 160B, . . . , to provide the "hold" function of a sample-and-hold circuit.

Figure 7:
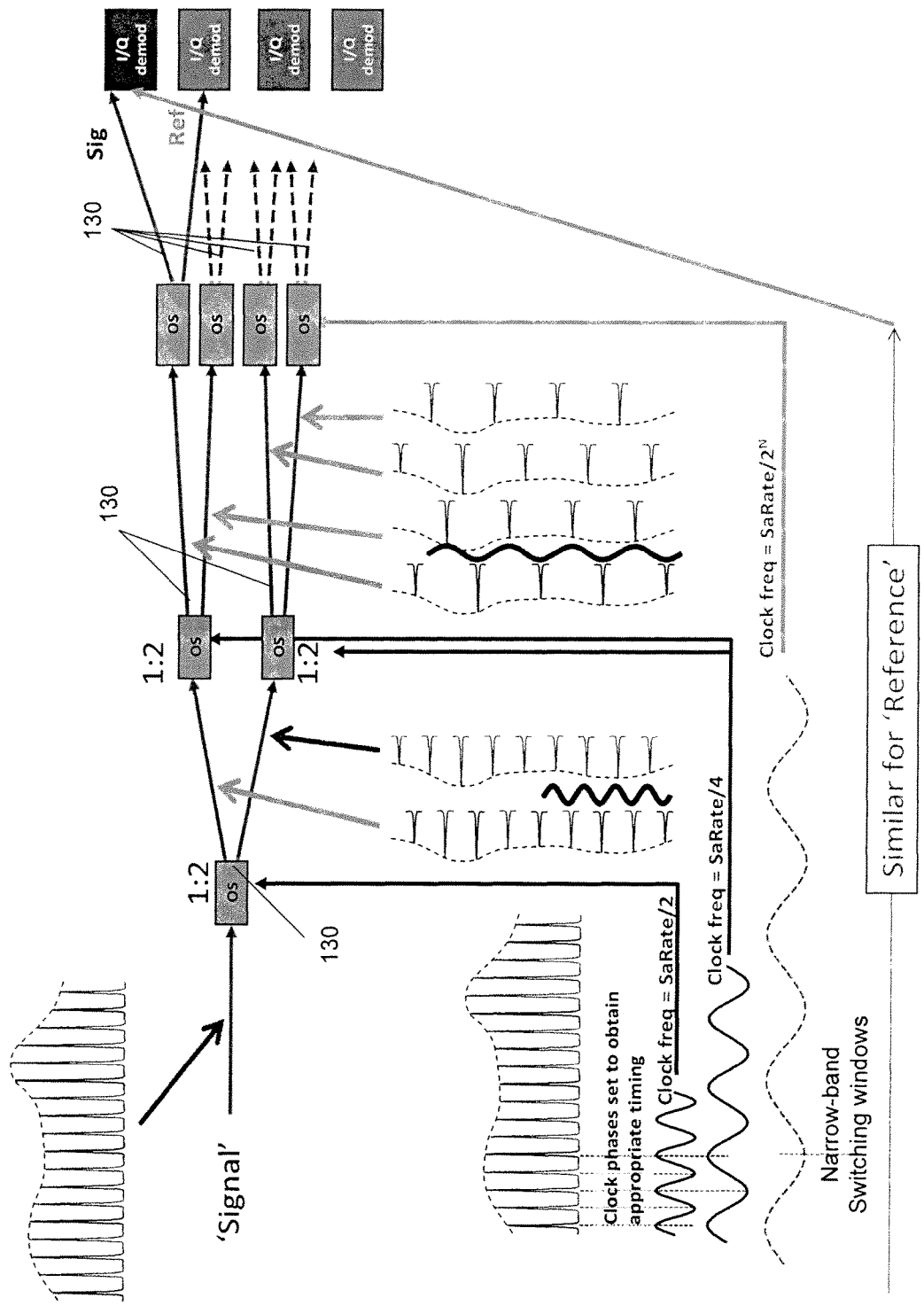
FIG. 7 is a block diagram of a clock distribution tree for the clock signals provided to components of a pADC or optical deserializer according to the fourth exemplary embodiment.

FIG. 7 is a block diagram of a clock distribution tree for the clock signals provided to components of a pADC or optical deserializer with gated detectors by the clock distribution unit according to the fourth exemplary embodiment. FIG. 7 also shows that the switching window shifts for each of the first through nth stages of OSs 130 in the pADC or optical deserializer with gated detectors according to the fourth exemplary embodiment.

Figure 8:
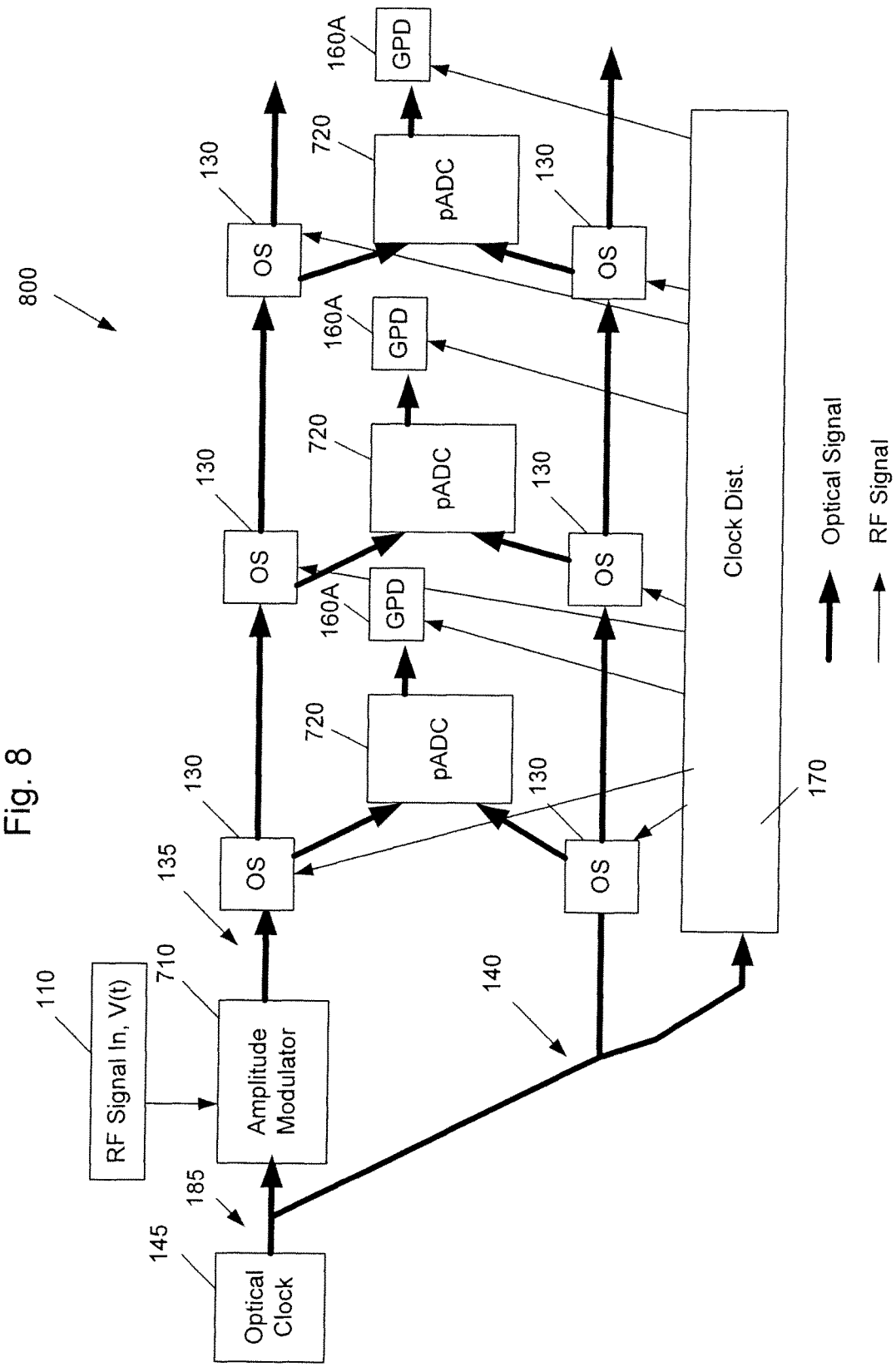
FIG. 8 is a block diagram of an optical deserializer with gated detectors according to a fifth exemplary embodiment.

FIG. 8 shows an optical deserializer with gated detectors 800 according to a fifth embodiment. The configuration of the optical deserializer with gated detectors 700 is similar to that as shown in FIGS. 1 and 3, but with the clock signal being amplitude modulated by amplitude modulator 710 according to the RF input signal 110 instead of being phase modulated by a phase modulator. Also, the processing of the rf input signal is shown as being performed by pADCs 720 instead of by I/Q Demodulators, whereby the pADCs provide digital outputs to gated detector 160A, 160B, . . . .

It is understood that while the detailed drawings, specific examples, material types, thicknesses, dimensions, and particular values given provide a preferred exemplary embodiment of the present invention, the preferred exemplary embodiment is for the purpose of illustration only. The method and apparatus of the invention is not limited to the precise details and conditions disclosed. For example, although specific types of optical component, dimensions and angles are mentioned, other components, dimensions and angles can be utilized. Also, while an optical deserialization with gated detectors system and method have been described above with respect to inclusion in a wideband or a narrowband receiver, it can be implemented in other types of high-frequency band receivers, such as receivers operating up to hundreds of GHz. Various changes may be made to the details disclosed without departing from the spirit of the invention which is defined by the following claims.

What is claimed is:

1. A photonic processor, comprising:
a phase modulator configured to receive a first electronic signal and an optical clock signal, the optical clock signal received from an optical clock circuit on a first path, and to provide a phase modulated optical pulse signal;
at least one optical demodulator respectively configured to receive the phase modulated optical pulse signal on a signal path and the optical clock signal on a reference path from the optical clock circuit, wherein the at least one optical demodulator is configured to perform demodulation of the phase modulated optical pulse signal at timings corresponding to the optical clock signal received from the optical clock circuit on the reference path to provide an optical I demodulated signal on a first output of the optical demodulator and an optical Q demodulated signal on a second output of the optical demodulator; and
at least one photo converter configured to receive at least one of the optical I demodulated signal and the optical Q demodulated signal and to provide a second electronic signal corresponding to the at least one of the optical I demodulated signal and the optical Q demodulated signal, each photo converter of the at least one photo converter including an optical gate configured to hold the at least one of the optical I demodulated signal and the optical Q demodulated signal at timings corresponding to the optical clock signal and a photodetector configured to provide the second electronic signal, the optical gate between the at least one optical demodulator and the photodetector, wherein sampling is performed in the optical domain.

2. The photonic processor according to claim 1, further comprising:
a clock generator configured to provide an electronic clock signal to the photo converter.

3. The photonic processor according to claim 2, wherein the photonic processor operates as a sample-and-hold circuit wherein the optical clock signal and phase modulator perform a sample function of the sample-and-hold circuit and the photo converter performs a hold function of the sample-and-hold circuit.

4. The photonic processor according to claim 1, wherein the signal path and the reference path are separate paths that do not directly intersect or directly connect with each other.

5. The photonic processor according to claim 1, wherein the optical clock circuit is a mode locked laser or a coupled opto-electronic oscillator.

6. A method of multi-dimensional quantization, the method comprising:
performing phase modulation and providing a phase-modulated optical pulse signal based on an optical clock signal received from an optical clock circuit;
performing by at least one optical demodulator, demodulation of the phase-modulated optical pulse signal at timings corresponding to the optical clock signal received on a reference path from the optical clock circuit to provide an optical I demodulated signal and an optical Q demodulated signal;
receiving, by a first photo converter, the optical I demodulated signal;
receiving, by a second photo converter, the optical Q demodulated signal;
converting, by a first photodetector of the first photo converter, the optical I demodulated signal to a first electronic signal;
converting, by a second photodetector of the second photo converter, the optical Q demodulated signal to a second electronic signal;
holding, by a first optical gate of the first photo converter, the optical I demodulated signal at timings corresponding to the optical clock signal, the first optical gate between the at least one optical demodulator and the first photodetector; and
holding, by a second optical gate of the second photo converter, the optical Q demodulated signal at timings corresponding to the optical clock signal, the second optical gate between the at least one optical demodulator and the second photodetector.

7. The method according to claim 6, wherein a sample-and-hold function is performed using an optical clock signal and a phase modulator to perform a sample function and the plurality of pairs of gated photodetectors to perform a hold function.

8. The method according to claim 6, wherein a signal path receives the phase-modulated optical pulse signal and the reference path receives the optical clock signal, the signal path and the reference path are separate paths that do not directly intersect or directly connect with each other.

9. The method according to claim 6, wherein the phase modulation uses a radio frequency electronic signal and a reference optical clock signal.

10. A photonic processor, comprising:
a phase modulator configured to receive an electronic radio frequency signal and an optical clock signal, the optical clock signal received from an optical clock circuit on a first path, and to provide a phase-modulated optical signal;
a demodulator configured to receive the phase-modulated optical signal output by the phase modulator on a signal path, to receive the optical clock signal on a reference path from the optical clock circuit, and to perform demodulation of the phase-modulated optical signal at timings corresponding to the optical clock signal received on the reference path from the optical clock circuit, wherein the demodulator provides an optical I demodulated signal and an optical Q demodulated signal; and
first and second photodetectors coupled to the demodulator and configured to receive respectively the optical I demodulated signal and the optical Q demodulated signal, each photodetector comprising (1) an optical gate configured to hold the respective optical I demodulated signal or optical Q demodulated signal at timings corresponding to the optical clock signal, and (2) a photodetector device configured to provide an electronic demodulated signal corresponding to the respective optical I demodulated signal or optical Q demodulated signal, each optical gate being disposed between the demodulator and the corresponding photodetector device.

11. The photonic processor according to claim 10, further comprising:
first and second electronic quantizers coupled to the first and second photodetectors, respectively, and configured to perform electronic quantization of each respective electronic demodulated signal as first and second digital signals.

12. The photonic processor according to claim 10, further comprising:
an optical clock configured to output the optical clock signal to the phase modulator and to the reference path, wherein the phase modulator performs phase modulation of the phase-modulated optical signal at timings corresponding to the optical clock signal.

13. The photonic processor according to claim 10, wherein the photonic processor operates as a sample-and-hold circuit, wherein the optical clock signal and phase modulator perform a sample function of the sample-and-hold circuit and the photodetectors perform a hold function of the sample-and-hold circuit.

14. The photonic processor according to claim 10, further comprising:
   a plurality of optical switches provided on the reference path and the signal path;
   additional demodulators configured to receive the phase-modulated optical signal output by a respective optical switch on the signal path, and to perform demodulation of the phase-modulated optical signal in response to the optical clock signal received from a respective optical switch on the reference path.

15. The photonic processor according to claim 14, further comprising:
   additional first and second photodetectors respectively coupled to the additional demodulators.

\* \* \* \* \*